(12) United States Patent
Boedt et al.

(10) Patent No.: US 9,911,641 B2
(45) Date of Patent: Mar. 6, 2018

(54) PROCESS FOR MANUFACTURING A SEMICONDUCTOR SUBSTRATE, AND SEMICONDUCTOR SUBSTRATE OBTAINED

(71) Applicant: Soitec, Crolles (FR)

(72) Inventors: Francois Boedt, Meylan (FR); Roland Brun, Varces (FR); Olivier Ledoux, Grenoble (FR); Eric Butaud, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/372,659

(22) PCT Filed: Jan. 14, 2013

(86) PCT No.: PCT/IB2013/000068
§ 371 (c)(1),
(2) Date: Jul. 16, 2014

(87) PCT Pub. No.: WO2013/108120
PCT Pub. Date: Jul. 25, 2013

(65) Prior Publication Data
US 2014/0346639 A1 Nov. 27, 2014

(30) Foreign Application Priority Data
Jan. 20, 2012 (FR) ..................... 12 50581

(51) Int. Cl.
*H01L 21/762* (2006.01)
*H01L 21/66* (2006.01)
*H01L 29/36* (2006.01)

(52) U.S. Cl.
CPC ........ *H01L 21/76254* (2013.01); *H01L 22/12* (2013.01); *H01L 22/20* (2013.01); *H01L 29/36* (2013.01)

(58) Field of Classification Search
None
See application file for complete search history.

(56) References Cited

U.S. PATENT DOCUMENTS 4,364,074 A * 12/1982 Garnache .......... H01L 21/76877
257/302
6,180,497 B1 * 1/2001 Sato et al. .................... 438/458
(Continued)

FOREIGN PATENT DOCUMENTS

| CN | 100379006 C | 4/2008 |
|----|-------------|--------|
| CN | 101207009 A | 6/2008 |

(Continued)

OTHER PUBLICATIONS

Danielson et al., Surface-Energy-Driven Dewetting Theory of Silicon-on-Insulator Agglomeration, Journal of Applied Physics, vol. 100, No. 8, Oct. 20, 2006, pp. 083507-1-083507-10.

(Continued)

*Primary Examiner* — Peter Bradford
(74) *Attorney, Agent, or Firm* — TraskBritt

(57) ABSTRACT

The invention relates to a process for manufacturing a semiconductor substrate, characterized in that it comprises providing at least one donor semiconductor substrate comprising at least one useful silicon layer; inspecting the donor substrate via an inspecting machine in order to detect whether the useful layer contains emerging cavities of a size larger than or equal to a critical size, said critical size being strictly smaller than 44 nm; and manufacturing a semiconductor substrate comprising at least part of the useful layer of the donor substrate if, considering cavities of a size larger than or equal to the critical size, the density or number of cavities in the useful layer of the donor substrate is lower than or equal to a critical defect density or number.

12 Claims, 4 Drawing Sheets

(56) References Cited

U.S. PATENT DOCUMENTS

| | | |
|---|---|---|
| 6,342,725 B2 | 1/2002 | Falster |
| 8,169,606 B2 | 5/2012 | Oka et al. |
| 2005/0229842 A1 | 10/2005 | Umeno et al. |
| 2005/0245048 A1 | 11/2005 | Graf et al. |
| 2006/0037941 A1* | 2/2006 | Weng ............... G01N 21/01 216/84 |
| 2007/0092178 A1* | 4/2007 | Gaebe ............... G02B 6/421 385/14 |
| 2008/0153272 A1 | 6/2008 | Akiyama et al. |
| 2010/0059861 A1* | 3/2010 | Mueller ............... C30B 15/04 257/617 |
| 2011/0201176 A1* | 8/2011 | Ramappa et al. ........... 438/458 |
| 2011/0242312 A1* | 10/2011 | Seki ............... G01N 21/9505 348/125 |
| 2012/0156860 A1 | 6/2012 | Ramappa et al. |
| 2014/0327112 A1* | 11/2014 | Libbert ............... G01N 1/32 257/617 |

FOREIGN PATENT DOCUMENTS

| | | |
|---|---|---|
| JP | 2000216208 A | 8/2000 |
| TW | 201133566 A1 | 10/2011 |

OTHER PUBLICATIONS

International Search Report for International Application No. PCT/IB2013/000068 dated Mar. 19, 2013, 4 pages.
Chinese Search Report for Chinese Application No. 2013800060345 dated Feb. 6, 2016, 17 pages.
International Preliminary Report for International Application No. PCT/IB2013/000068 dated Jul. 22, 2014, 6 pages.
International Written Opinion for International Application No. PCT/IB2013/000068 dated Jul. 22, 2014, 5 pages.
Chinese Supplementary Search for Chinese Application No. 201380006034 dated Nov. 8, 2016, 1 page.

* cited by examiner

PROCESS FOR MANUFACTURING A SEMICONDUCTOR SUBSTRATE, AND SEMICONDUCTOR SUBSTRATE OBTAINED

CROSS-REFERENCE TO RELATED APPLICATIONS

This application is a national phase entry under 35 U.S.C. § 371 of International Patent Application PCT/IB2013/000068, filed Jan. 14, 2013, designating the United States of America and published in English as International Patent Publication WO 2013/108120 A1 on Jul. 25, 2013, which claims the benefit under Article 8 of the Patent Cooperation Treaty and under 35 U.S.C. § 119(e) to French Patent Application Serial No. 1250581, filed Jan. 20, 2012, the disclosure of each of which is hereby incorporated herein in its entirety by this reference.

TECHNICAL FIELD

The invention relates to a process for manufacturing a semiconductor substrate and to a semiconductor substrate.

BACKGROUND

In certain processes for manufacturing semiconductor substrates, it is necessary to transfer thin useful semiconductor layers from a donor substrate to a receiver substrate.

This is especially the case during the manufacture of FDSOI (fully depleted silicon-on-insulator) substrates.

These FDSOI substrates are increasingly used in the microelectronics industry.

These substrates comprise a thin useful silicon film, which is generally less than 300 Ångströms in thickness, placed on a buried oxide layer.

During the manufacture of FDSOIs, sample FDSOI substrates belonging to substrate batches are inspected at the end of the manufacturing process in order to check the defect density present in the useful layer.

It has been observed that defect density varies from one substrate to another and from one batch of substrates to another. Therefore, it is necessary to implement procedures enabling the quality of these FDSOIs to be controlled.

Furthermore, certain FDSOIs obtained from certain manufacturing lines prove to be unusable because of the presence of crystal defects.

This has an impact on manufacturing costs, which would be desirable to reduce.

Finally, the quality of the manufacturing processes used could be improved, with a view to standardizing the process and improving the quality of the manufacture.

BRIEF SUMMARY

In one embodiment, a process is described for manufacturing a semiconductor substrate, noteworthy in that it comprises providing at least one donor semiconductor substrate comprising at least one useful silicon layer; inspecting the donor substrate via an inspecting machine in order to detect whether the useful layer contains emerging cavities of a size larger than or equal to a critical size, the critical size being strictly smaller than 44 nm; and manufacturing a semiconductor substrate comprising at least part of the useful layer of the donor substrate if, considering emerging cavities of a size larger than or equal to the critical size, the density or number of cavities in the useful layer of the donor substrate is lower than or equal to a critical defect density or number.

In one embodiment, the step of manufacturing the semiconductor substrate comprises transferring at least part of the useful layer of the donor substrate to a receiver substrate, the part having a thickness of 300 Ångströms or less and the receiver substrate forming the semiconductor substrate after the transfer.

In one embodiment, the step of manufacturing the semiconductor substrate comprises forming an oxide layer making contact with the useful layer of the donor substrate, and transferring the oxide layer and at least part of the useful layer to a receiver substrate, the receiver substrate forming the semiconductor substrate after this transfer.

In one embodiment, the step of transferring the oxide layer and at least part of the useful layer to the receiver substrate comprises creating a weak zone in the donor substrate by introducing ions into the donor substrate, bonding the donor substrate and the receiver substrate, and cleaving the weak zone in order to detach the donor substrate from the receiver substrate.

In one embodiment, the critical defect number is between 0 and 200.

In one embodiment, the step of inspecting via the inspecting machine comprises emitting a laser beam toward the donor substrate and detecting changes in the optical characteristics of the laser beam reflected by the donor substrate in order to detect emerging cavities and to estimate their size.

In one embodiment, the manufacturing process described above is used to manufacture a plurality of semiconductor substrates in series, using steps comprising providing a plurality of donor semiconductor substrates, each comprising at least one useful silicon layer; inspecting the plurality of donor substrates and selecting those donor substrates that have, considering emerging cavities of a size larger than or equal to a critical size, a density or a number of cavities lower than or equal to a critical defect number or density, the critical size being strictly smaller than 44 nm; and manufacturing a plurality of semiconductor substrates, each comprising at least part of a useful layer of one of the donor substrates selected in the preceding step.

In one embodiment, the manufacturing step comprises manufacturing a semiconductor substrate comprising a useful silicon layer that is 300 Ångströms or less in thickness, an oxide layer, and a supporting layer.

A semiconductor substrate is also described, the substrate comprising a useful semiconductor layer that is 300 Ångströms or less in thickness, an oxide layer, and a supporting layer, the substrate being noteworthy in that the useful layer has a density of emerging cavities strictly lower than 0.06 defects/cm$^2$.

The manufacturing process is effective and has a predictable and guaranteed quality.

Substrates comprising a thin useful semiconductor layer are manufactured, the useful layer possibly being used in electronic applications, this layer, despite its thinness, not suffering from the presence of defects compromising its use. They are, for example, FDSOIs, the useful layer of which is between 0 and 300 Ångströms in thickness.

Furthermore, the proposed solution makes it possible to reduce the number of steps in the manufacturing process, and reduce manufacturing costs, because undesirable donor substrates are scrapped beforehand, upstream of the manufacturing process.

BRIEF DESCRIPTION OF THE FIGURES

Other features, aims and advantages of the invention will become apparent from the following description, which is given purely by way of non-limiting illustration, and which should be read with regard to the appended figures, in which.

DETAILED DESCRIPTION

Figure 1:
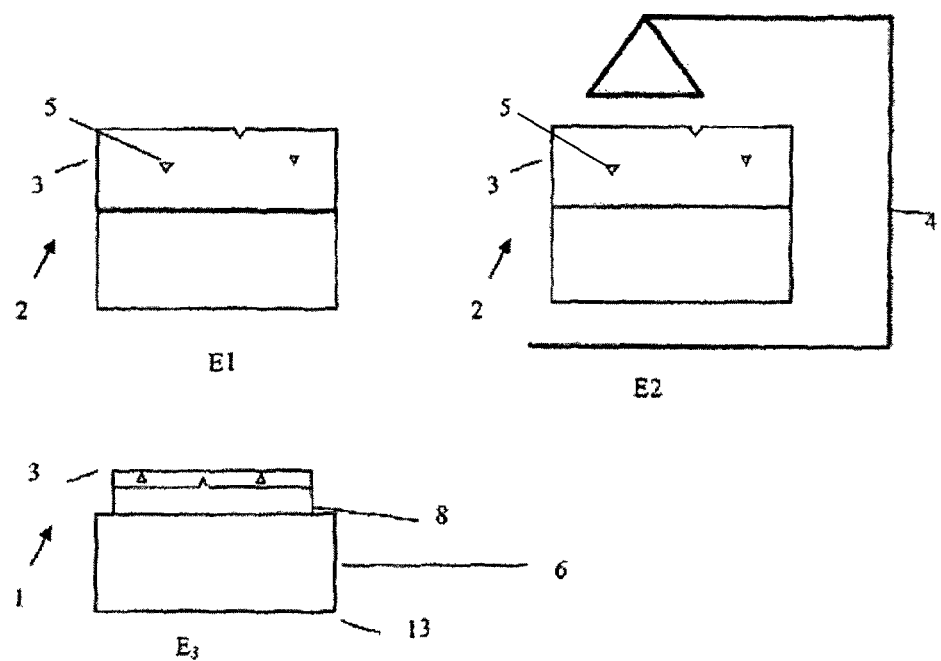
FIG. 1 schematically shows steps of one embodiment of the manufacturing process.
Figure 2:
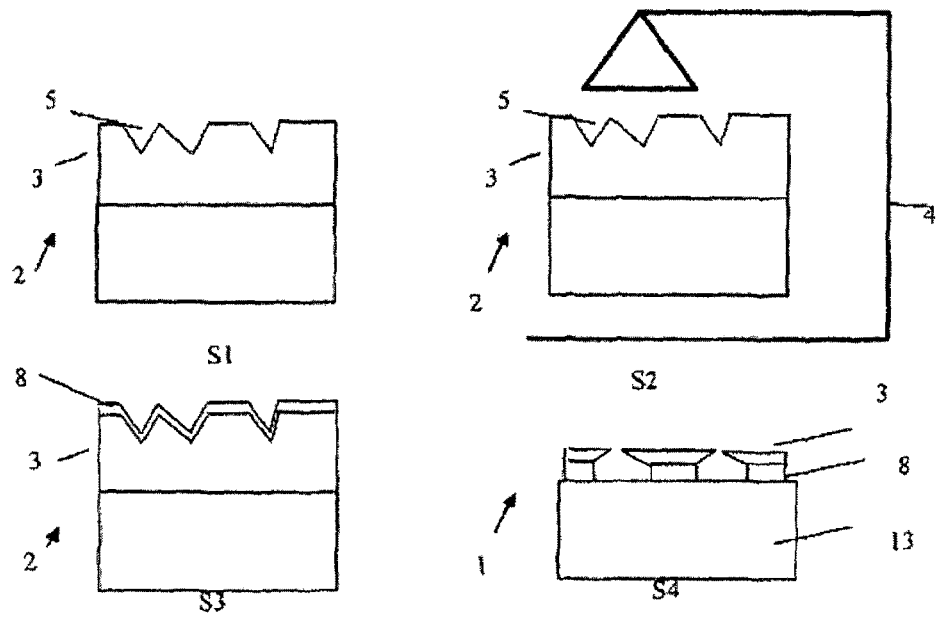
FIG. 2 schematically shows steps of one embodiment of the manufacturing process.

FIGS. 1 and 2 illustrate one embodiment of a process for manufacturing a semiconductor substrate.

The process comprises a step E1 comprising providing at least one donor semiconductor substrate 2 comprising at least one useful semiconductor layer 3. At least part of the useful semiconductor layer 3 is intended to be transferred from the donor substrate 2 to a receiver substrate 6, in order to manufacture a semiconductor substrate 1. A semiconductor substrate 1 is a substrate comprising at least one layer made of a semiconductor.

In one embodiment, the donor semiconductor substrate 2 is a bulk substrate comprising only the useful semiconductor layer 3.

In one embodiment, the useful layer 3 is a silicon layer. Alternatively, other useful layers may be used, such as germanium or SiGe layers, for example.

The process comprises a step E2 comprising inspecting the donor substrate 2, via an inspecting machine 4, in order to detect whether the useful layer 3 contains emerging cavities 5 of a size larger than or equal to a critical size, said critical size being strictly smaller than 44 nm.

Any value smaller than 44 nm may be chosen for the critical size, insofar as the inspecting machine 4 is sufficiently precise to detect cavities 5 of this critical size (depending on the machine used and the requirements, examples of critical-size values are: 33 nm, 28 nm, etc.). It has been observed that a critical-size value smaller than 44 nm enables a satisfactory number of emerging cavities 5 to be identified, in particular, in the case of FDSOI manufacturing processes, as will be explained below.

These cavities 5 are found on the surface of the useful layer 3, and emerge onto the free surface of the useful layer 3. The size of the cavities 5 corresponds to the height of these cavities 5 along a normal to the plane of the substrate 2. The cavities 5 (also called micro-holes) result from vacancies, which consist of an absence of atoms, in the crystal of the useful layer 3.

If, considering emerging cavities 5 of a size larger than or equal to the critical size, inspecting the donor substrate 2 reveals that the density or number of cavities 5 in the useful layer 3 of the donor substrate 2 is lower than or equal to a critical defect density or number, the manufacturing process continues using the donor substrate 2.

In particular, the process then comprises a step E3 comprising manufacturing a semiconductor substrate 1 comprising at least part of the useful layer 3 of the donor substrate 2 (see FIG. 1).

In contrast, if, considering emerging cavities 5 of a size larger than or equal to the critical size, inspecting the donor substrate 2 reveals that the density or number of cavities 5 in the donor substrate 2 is higher than a critical defect density or number, the useful layer 3 of this donor substrate 2 is not transferred to a receiver substrate. This is illustrated in FIG. 2, where the inspection (S1, S2) of the useful layer 3 reveals that the number or density of emerging cavities 5 of a size larger than the critical size is higher than the critical defect density or number.

For a useful layer that is between 0 and 300 Ångströms in thickness, the critical defect number is, for example, between 0 (i.e., no cavities are allowed) and 200. The critical density (area density, i.e., corresponding to the number of cavities divided by the area of the layer) is, for example, between 0 and 0.28 defects/cm$^2$.

In one embodiment, the process comprises transferring at least part of the useful layer 3 of the donor substrate 2 to a receiver substrate 6, the part having a thickness of 300 Ångströms or less, the receiver substrate 6 forming the semiconductor substrate 1 with this transfer.

In one embodiment, the semiconductor substrate 1 manufactured using the manufacturing process comprises a useful layer 3 that is 300 Ångströms or less in thickness, an oxide layer 8, and a supporting layer 13. The supporting layer is, for example, a silicon layer. According to one embodiment, the useful layer 3 is a silicon layer, and the substrate 1 is, therefore, an FDSOI. The useful silicon layer of FDSOI substrates is, in general, smaller than or equal to 300 Ångströms in thickness, and may, by way of non-limiting example, be 120 Ångströms or 60 Ångströms in thickness.

It has been observed, after detailed analysis of the processes used to manufacture the semiconductor substrates 1 and the defects present in the semiconductor substrates 1, such as, for example, FDSOI substrates, that the emerging cavities 5, also called microcavities, present upstream in the useful layer 3 of the donor substrate 2 were the origin of microcavities 7 in the useful layer 3 of the final semiconductor substrate intended to be used in electronic applications. The microcavities 7 present in the useful layer 3 of the final semiconductor substrate impair the useful layer 3 making it unsuitable for use in many applications.

Figure 3:
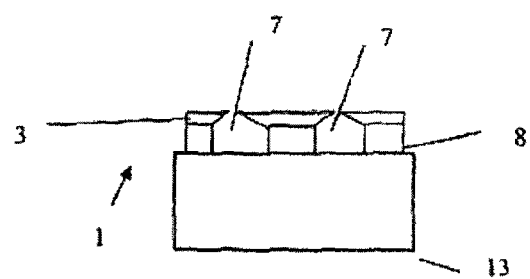
FIG. 3 schematically shows a semiconductor substrate having cavities preventing its use.

In particular, emerging microcavities 5 with a diameter larger than the critical size defined above, present in the useful layer 3 of the donor substrate 2, lead to microcavities 7 being created in the useful layer of the semiconductor substrate 1 produced by the manufacturing process. As illustrated very schematically in FIG. 3 (which drawing is not to scale), emerging microcavities 5 with a diameter larger than the critical size, present in the useful layer 3 of the donor substrate 2, lead to cavities 7 being created in the useful layer 3 of the semiconductor substrate 1, which cavities 7 emerge onto the free surface of the useful layer 3. This is especially the case for ultra-thin layers that are between 0 and 300 Ångströms in thickness. These emerging cavities 7 prevent the useful layer from being used.

In particular, in certain cases, the cavities 7 present in the useful layer 3 of the final substrate 1 emerge both onto the free surface of the useful layer 3 and onto the interface between the useful layer 3 and the adjacent buried layer (oxide layer 8), and even onto the interface between this oxide layer 8 and the adjacent buried layer (supporting layer 13).

Cavities 5 that emerge onto the supporting layer 13 are, for example, produced when the useful layer 3 of a substrate 2 having cavities 5 emerging onto the free surface of the useful layer 3 is oxidized (see the substrate in FIG. 2, step S3 and S4), the assembly comprising the useful layer 3 and the oxide then being transferred to a supporting layer of a final substrate 1, for example, using a process, such as the SMART CUT® process, especially comprising molecular implantation, bonding and a cleave. In this case, cavities 5 emerging both onto the free surface of the useful layer 3 and onto the interface between the oxide layer 8 and the supporting layer 13 are created, thereby making the useful layer 3 unusable (FIG. 2, step S4).

Inspecting the useful layer 3 of the donor substrate 2 upstream of the manufacturing process makes it possible to ensure that emerging cavities 7 with a diameter larger than the critical size are absent from the useful layer 3 of the semiconductor substrate 1, or present in a number lower than a critical number.

Thus, semiconductor substrates comprising a useful thin layer that is between 0 and 300 Ångströms in thickness and produced by the manufacturing process can be used, there being no need to inspect and scrap some of the manufactured substrates downstream of the manufacturing process.

The critical size is strictly smaller than 44 nm. The value chosen for the critical size in this range depends on the desired precision, on the desired final quality, on the inspecting machine, on the desired inspection speed, and on other manufacturing parameters. For example, the smaller the critical size, the lower the inspection speed of the inspecting machine, thereby reducing the yield of the manufacturing process but improving the detection of defects, even defects of smaller diameter.

In one embodiment, the critical size is chosen to be smaller than 44 nm and to be smaller than or equal to the thickness of the useful layer 3 to be transferred from the donor substrate 2. By way of this inspection, any cavities 5, 7 emerging onto the free surface of the useful layer 3 do not appear in the useful layer 3 of the final semiconductor substrate 1.

Figure 4:
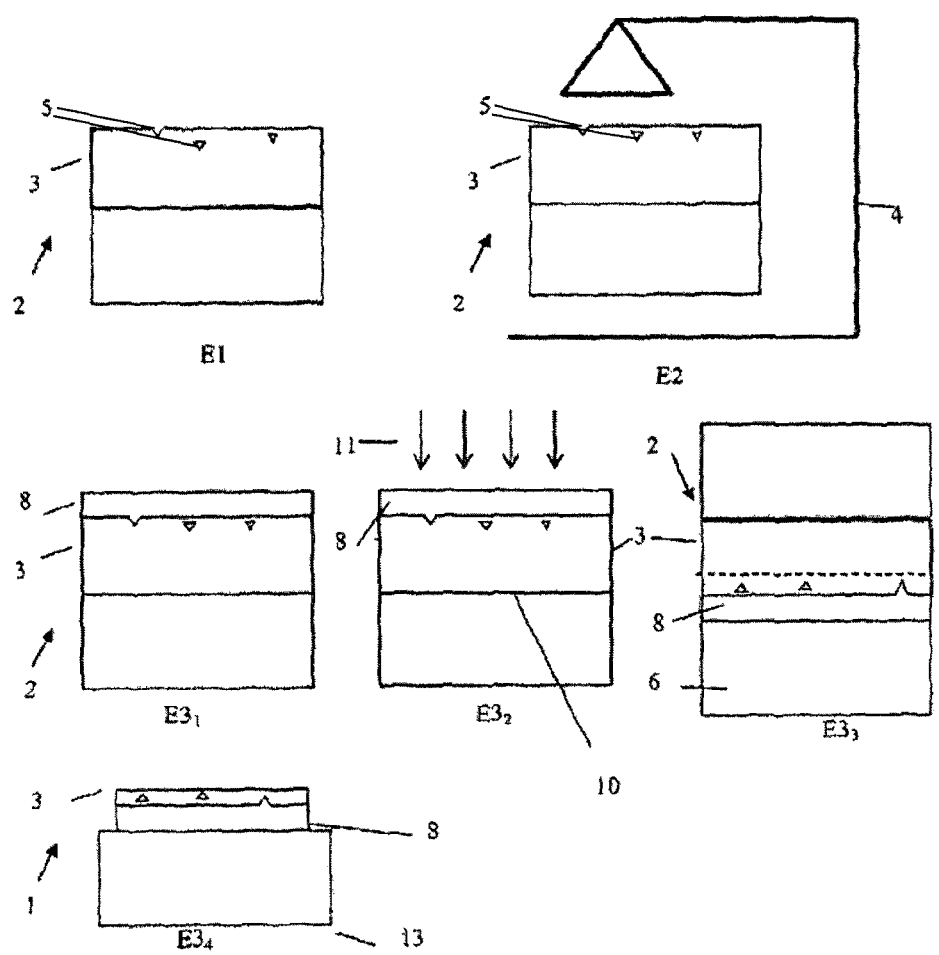
FIG. 4 schematically shows steps of one embodiment of the manufacturing process.

In one embodiment, illustrated in FIG. 4, the step of manufacturing the semiconductor substrate 1 comprises:
  forming an oxide layer 8 making contact with the useful layer 3 of the donor substrate 2 (step $E3_1$); and
  transferring (steps $E3_2$, $E3_3$, $E3_4$) the oxide layer 8 and at least part of the useful layer 3 to a receiver substrate 6, the receiver substrate 6 forming the semiconductor substrate 1 after the transfer.

In one embodiment, the step of transferring the oxide layer 8 and at least part of the useful layer 3 to the receiver substrate 6 comprises:
  creating (step $E3_2$) a weak zone 10 in the donor substrate 2 by introducing ions 11 into the donor substrate 2;
  bonding (step $E3_3$) the donor substrate 2 and the receiver substrate 6; and
  cleaving (step $E3_4$) the weak zone 10 in order to detach the donor substrate 2 from the receiver substrate 6.

The ions 11 are, for example, hydrogen or helium ions. Co-implantation of hydrogen and helium ions may also be employed.

The donor substrate 2 is bonded to the oxide layer 8.

The cleave is generally achieved by heating, as is known for the SMART CUT® process.

Alternatively, or in addition, an oxide layer may be formed on the receiver substrate 6.

As mentioned above, defects are inspected for using an inspecting machine 4.

In one embodiment, the inspecting step, via the inspecting machine 4, comprises:
  emitting a laser beam toward the donor substrate 2; and
  detecting changes in the optical characteristics of the laser beam reflected by the useful layer 3 of the donor substrate 2 in order to detect cavities 5 emerging at the surface of the useful layer 3 and to estimate their size.

The donor substrate is, in general, placed on a moveable holder in the inspecting machine 4, such as, for example, a rotary holder.

According to one aspect, the laser beam emitted toward the donor substrate is diffracted by the emerging cavities 5 present on the surface of the useful layer 3. The inspecting machine 4 measures the wavelength of the light diffracted by the useful layer 3. A processing unit of the inspecting machine 4, whether an integrated unit or an external unit, compares the wavelength of the diffracted light with a reference curve, which provides information linking the characteristics of the diffracted light to the size of the cavities 5. The result of this comparison depends on the size of the defects and their number, thereby allowing, optionally with other measurements, the size of the defects, and their number, to be deduced since diffraction power is proportional to defect size. In addition, non-spherical defects diffract differently to spherical defects. This type of inspecting machine is commercially available, an example being the "SURFSCAN® SP2" inspecting machine sold by KLA Tencor. Several versions of this machine are available.

In one embodiment, the manufacturing process is used to manufacture a plurality of semiconductor substrates, such as FDSOI substrates, in series.

Figure 5:
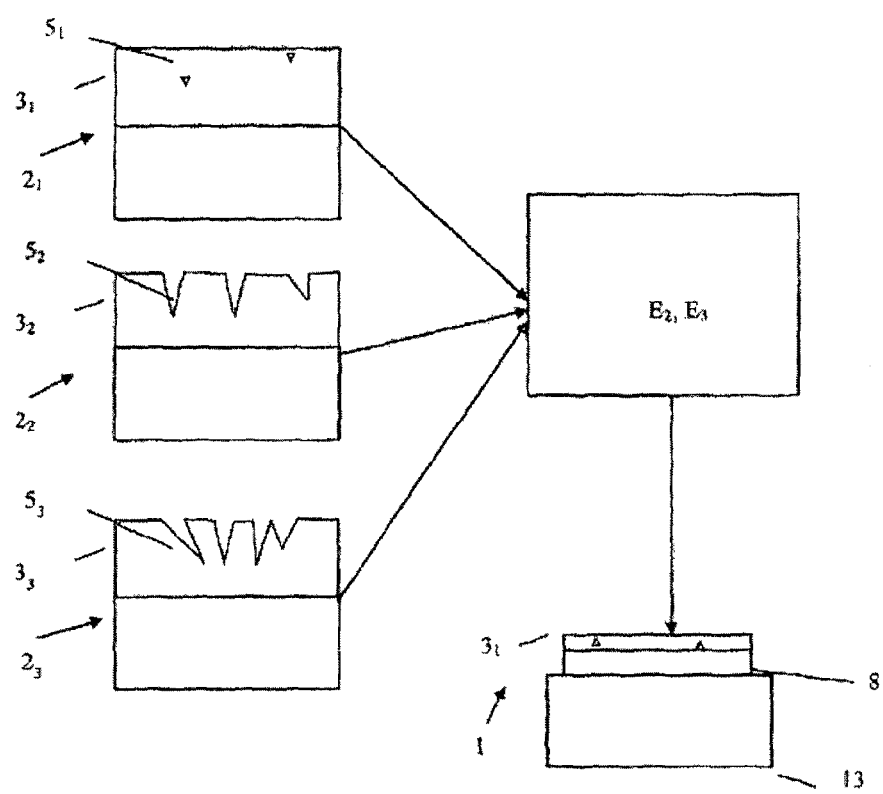
FIG. 5 schematically shows steps of one embodiment of a series manufacturing process.

As illustrated in FIG. 5, the process comprises:
  providing a plurality of donor semiconductor substrates 2, each comprising at least one useful silicon semiconductor layer 3;
  inspecting (step E2) the plurality of donor substrates 2 and selecting those donor substrates 2 that have, considering emerging cavities 5 of a size larger than or equal to the critical size, a density or a number of cavities 5 lower than or equal to a critical defect number or density, the critical size being strictly smaller than 44 nm; and
  manufacturing (step E3) a plurality of semiconductor substrates 1, each comprising at least part of a useful layer 3 of one of the donor substrates 2 selected.

Thus, donor substrates that do not meet the quality criteria in terms of cavity size (size smaller than the critical size, the value of which is strictly smaller than 44 nm) and number of cavities are scrapped upstream of the manufacturing process. The term "scrapped" is understood to mean that they are not used in this manufacturing process. Of course, they may, depending on the circumstances, be used in other processes.

Only the useful layers 3 of donor substrates 2 meeting these criteria are used to manufacture one or more semiconductor substrates 1. For example, in FIG. 5, only the donor substrate $2_1$ is selected after the useful layer of substrates $2_1$, $2_2$ and $2_3$ has been inspected for defects by the inspecting machine 4.

The series manufacturing process is, therefore, effective and has a predictable and guaranteed quality.

In particular, because the origin of the defects impairing the useful layer of the final substrate has been discovered, it is possible to preclude these defects upstream of the manufacturing process by removing donor substrates containing too many defects of a size larger than the critical size.

Furthermore, steps can be removed from the manufacturing process, because undesirable substrates are scrapped beforehand.

The semiconductor substrate obtained with the manufacturing process itself differs, by its quality, from prior-art substrates. In one embodiment, a semiconductor substrate 1 is obtained, comprising:

a useful semiconductor layer 3 that is 300 Ångströms or less in thickness;
an oxide layer 8; and
a supporting layer 13, the substrate being noteworthy in that the useful layer 3 has a density of emerging cavities 5 strictly lower than 0.06 defects/cm$^2$.

This density is the cavity density comprising: cavities 5 that emerge onto the free surface of the useful layer 3 and onto the oxide layer 8, and cavities 5 that emerge onto the free surface of the useful layer 3 and onto the interface between the oxide layer 8 and the supporting layer 13.

In particular, in one embodiment, the substrate 1 is an FDSOI substrate, where the useful layer 3 is a silicon layer. The supporting layer 13 may also be made of silicon. Other non-limiting examples include a supporting layer 13 made of sapphire or of quartz.

The various aspects of the invention enable a notable improvement of processes for manufacturing semiconductor substrates, in particular, substrates comprising a thin useful semiconductor layer.

The invention claimed is:

1. A process for manufacturing a semiconductor substrate, comprising:
providing at least one donor semiconductor substrate comprising at least one useful silicon layer;
inspecting the at least one donor semiconductor substrate with an inspecting machine and detecting whether the at least one useful silicon layer contains cavities extending into the at least one donor semiconductor substrate from an exposed free surface thereof of a size equal to or larger than a critical size, the critical size being smaller than 44 nm, each of the cavities emerging from a respective atomic vacancy in the crystal lattice during growth of the at least one useful silicon layer;
manufacturing a semiconductor substrate comprising at least part of the at least one useful silicon layer of the at least one donor semiconductor substrate if, considering the cavities of a size larger than or equal to the critical size, a density or number of the cavities in the at least one useful silicon layer of the at least one donor semiconductor substrate is equal to or lower than a critical defect density between 0 and 0.28 defects per square centimeter or a critical defect number between 0 and 200, the at least part of the at least one useful silicon layer comprising a layer having a thickness between 0 and 300 Ångströms; and
scrapping the at least one donor semiconductor substrate if the cavities of a size equal to or larger than the critical size and the density or number of the cavities in the at least one useful silicon layer of the at least one donor semiconductor substrate is greater than the critical defect density or the critical defect number.

2. The process of claim 1, wherein manufacturing the semiconductor substrate further comprises transferring the at least part of the at least one useful silicon layer of the at least one donor semiconductor substrate to a receiver substrate, the semiconductor substrate including the receiver substrate.

3. The process of claim 1, wherein manufacturing the semiconductor substrate further comprises:
forming an oxide layer in contact with the at least one useful silicon layer of the at least one donor semiconductor substrate; and
transferring the oxide layer and at least part of the at least one useful silicon layer to a receiver substrate, the semiconductor substrate including the receiver substrate.

4. The process of claim 3, wherein transferring the oxide layer and at least part of the at least one useful silicon layer to the receiver substrate comprises:
creating a weak zone in the at least one donor semiconductor substrate by introducing ions into the at least one donor semiconductor substrate;
bonding the at least one donor semiconductor substrate and the receiver substrate; and
cleaving the weak zone in order to detach the at least one donor semiconductor substrate from the receiver substrate.

5. The process of claim 1, wherein inspecting the at least one donor semiconductor substrate with an inspecting machine comprises:
emitting a laser beam toward the at least one donor semiconductor substrate; and
detecting changes in at least one optical characteristic of the laser beam reflected by the at least one donor semiconductor substrate in order to detect cavities extending into the at least one donor semiconductor substrate from an exposed free surface thereof from the at least one useful silicon layer and to estimate their size.

6. The process of claim 1, further comprising:
providing a plurality of donor semiconductor substrates, each comprising at least one useful silicon layer;
inspecting the plurality of donor substrates and selecting those donor substrates that have, considering the cavities of a size larger than or equal to a critical size, a density or a number of the cavities lower than or equal to the critical defect number or the critical defect density, the critical size being smaller than 44 nm; and
manufacturing a plurality of semiconductor substrates each comprising at least part of a useful layer of one of the selected donor substrates.

7. The process of claim 6, wherein providing a plurality of donor semiconductor substrates further comprises providing a plurality of donor semiconductor structures each including:
at least one useful silicon layer that is 300 Ångströms or less in thickness;
an oxide layer; and
a supporting layer.

8. A process for manufacturing semiconductor substrates from a plurality of donor semiconductor substrates, comprising:
providing a plurality of donor semiconductor substrates each comprising at least one useful silicon layer;
inspecting each donor semiconductor substrate of the plurality with an inspecting machine and detecting whether the at least one useful silicon layer contains cavities extending into the at least one donor semiconductor substrate from an exposed free surface thereof of a size equal to or larger than a critical size, the critical size being smaller than 44 nm, each of the cavities emerging from a respective atomic vacancy in the crystal lattice during growth of the at least one useful silicon layer;
separating donor semiconductor substrates of the plurality into two groups, a first group of the donor semiconductor substrates having a density or number of the cavities in the at least one useful silicon layer of the at least one donor semiconductor substrate equal to or lower than a critical defect density between 0 and 0.28 defects per square centimeter or a critical defect number between 0 and 200, and a second group of the donor semiconductor substrates having a density or number of the cavities in the at least one useful silicon layer of the at least one donor semiconductor substrate greater than the critical defect density or the critical defect number;

manufacturing a semiconductor substrate comprising at least part of the at least one useful silicon layer of each of the donor semiconductor substrates of the first group of the donor semiconductor substrates without manufacturing a semiconductor substrate using the donor semiconductor substrates of the second group of the donor semiconductor substrates, the at least part of the at least one useful silicon layer comprising a layer having a thickness between 0 and 300 Ångströms.

9. The process of claim 8, wherein manufacturing the semiconductor substrate using the donor semiconductor substrates of the first group of the donor semiconductor substrates comprises transferring the at least part of the at least one useful silicon layer of each of the donor semiconductor substrates to a respective receiver substrate, the semiconductor substrate including the receiver substrate.

10. The process of claim 8, wherein manufacturing the semiconductor substrate using the donor semiconductor substrates of the first group of the donor semiconductor substrates further comprises:

forming an oxide layer in contact with the at least one useful silicon layer of each of the donor semiconductor substrates; and transferring the oxide layer and at least part of the at least one useful silicon layer to a receiver substrate, the semiconductor substrate including the receiver substrate.

11. The process of claim 10, wherein transferring the oxide layer and at least part of the at least one useful silicon layer to the receiver substrate comprises:

creating a weak zone in the donor semiconductor substrate by introducing ions into the donor semiconductor substrate;

bonding the donor semiconductor substrate and the receiver substrate; and cleaving the weak zone in order to detach the donor semiconductor substrate from the receiver substrate.

12. The process of claim 8, wherein inspecting each donor semiconductor substrate of the plurality with the inspecting machine comprises:

emitting a laser beam toward the donor semiconductor substrate; and detecting changes in at least one optical characteristic of the laser beam reflected by the donor semiconductor substrate in order to detect the cavities extending into the at least one useful silicon layer from the exposed free surface thereof and to estimate their size.

* * * * *